United States Patent
Blodgett

Patent Number: 5,430,418
Date of Patent: Jul. 4, 1995

[54] POWER COMBINER/SPLITTER

[75] Inventor: James R. Blodgett, Derry, N.H.

[73] Assignee: AT&T Corp., Murray Hill, N.J.

[21] Appl. No.: 194,971

[22] Filed: Feb. 14, 1994

[51] Int. Cl.⁶ ............................................. H01P 5/12
[52] U.S. Cl. ..................................... 333/100; 333/124
[58] Field of Search ................. 333/100, 124, 129, 132

[56] References Cited

U.S. PATENT DOCUMENTS

| | | | |
|---|---|---|---|
| 3,697,895 | 10/1972 | Beck | 333/124 |
| 4,367,445 | 1/1983 | Dydyk | 333/127 |
| 4,556,856 | 12/1985 | Presser | 333/124 |
| 4,851,795 | 7/1989 | Beckwith | 333/100 |
| 5,045,821 | 9/1991 | Staudinger et al. | 333/132 X |

Primary Examiner—Paul Gensler
Attorney, Agent, or Firm—Jason P. DeMont

[57] ABSTRACT

A passive electric power splitter/combiner comprising a first inductor (117) between an input terminal and a first output terminal, a second inductor (119) between the input terminal and a second output terminal, a first capacitor (111) between the input terminal and ground, a second capacitor (113) between the first output terminal and ground, a third capacitor (115) between the second output terminal and ground, and a resistor (121) between the first output terminal and the second output terminal. Embodiments of the present invention can be fabricated that have little loss other than the intrinsic split loss, exhibit a uniform impedance at all ports, and exhibit electrical isolation between the output ports.

11 Claims, 2 Drawing Sheets

POWER COMBINER/SPLITTER

FIELD OF THE INVENTION

The present invention relates to electric circuit design in general, and more particularly, to a method and apparatus that can combine electrical signals, or that can split them.

BACKGROUND OF THE INVENTION

A passive power combiner/splitter is useful in electric circuit design for either combining two or more electric signals, or for dividing a single signal into two or more components. Passive power combiner/splitters in the prior art, such as the "Wilkinson" power divider, are too large and too expensive for some applications, and because of these disadvantages there has been a long felt need for smaller and less expensive combiner/splitters.

SUMMARY OF THE INVENTION

Embodiments of the present invention are capable of combining electrical signals, or of splitting them, and can be fabricated to be smaller and/or less expensive than devices in the prior art.

These results are obtained in an illustrative embodiment of the present invention that advantageously comprises, as shown in FIG. 1, three capacitors, two inductors and a resistor. Embodiments of the present invention can also be fabricated, as shown in FIG. 2, that function as a 3:1, 4:1 or N:1 combiner or splitter, where N is a whole number. Two or more embodiments of the present invention can be "ganged" or "cascaded" to make a 4:1, 6:1 or J:1 combiner or splitter, where J is the product of two whole numbers.

DETAILED DESCRIPTION

It is preferred that embodiments of the present invention be used on narrowband signals (i.e., less than an octave). When the center frequency of the narrowband signal is in the range of 500 MHz to 3000 MHz, it is preferred that embodiments of the present invention be fabricated with surface mount spiral inductors. It is deemed particularly advantageous to use embodiments of the present invention in applications where transformer-coupled circuits are lossy, and in applications where fully distributed circuits (using e.g., Wilkinson-type dividers) are physically large or expensive. For the purposes of this specification, the term "inductor" is defined to include both spiral inductors, conventional inductors, and any other device that predominantly exhibits inductance.

Each of the illustrative embodiments is preferably fabricated with "lumped" elements, e.g., capacitors, inductors and resistors, whose respective values are preferably chosen so that the embodiment: (1) acts as an impedance inverter, (2) is reciprocal, and (3) exhibits a 90° phase shift in the transmission mode.

Figure 1:
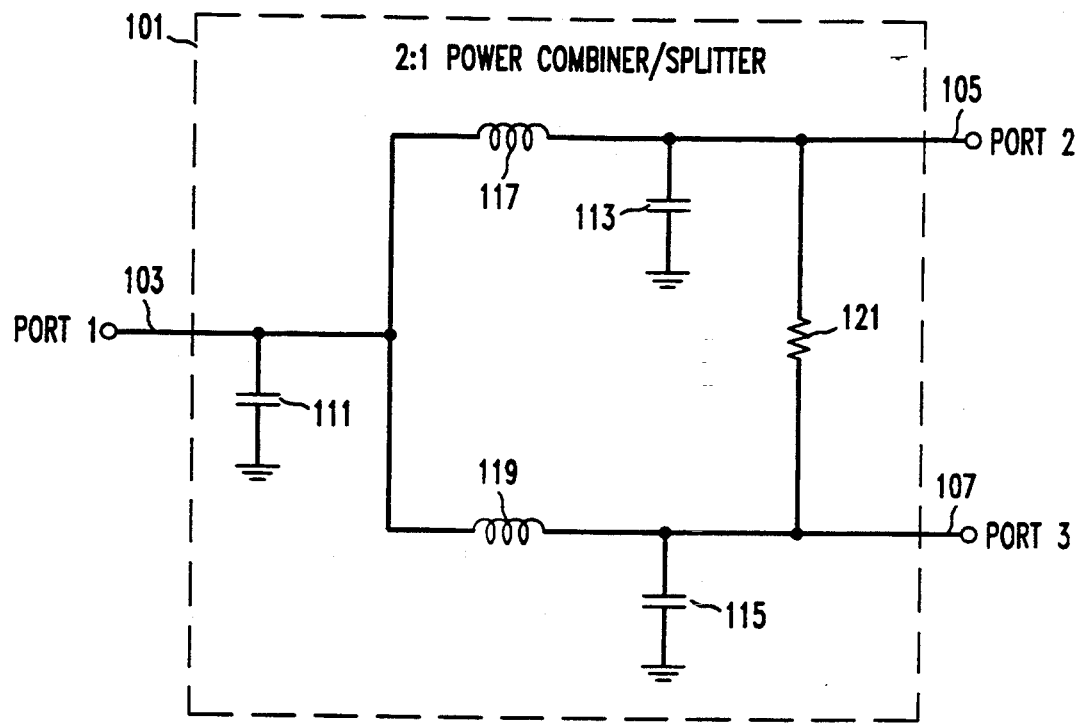
FIG. 1 shows a schematic diagram of an illustrative embodiment of the present invention which functions as either a 2:1 combiner or splitter, depending on context.

Referring to FIG. 1, the illustrative embodiment comprises six "lumped" elements: capacitor 111, capacitor 113, capacitor 115, inductor 117, inductor 119 and resistor 121. When the characteristic impedance of the embodiment is desired to be $Z_0$ ohms at Port 1, Port 2 and Port 3, the value of resistor 121 is preferably chosen to be $2Z_0$ ohms. The capacitance of capacitor 111 is preferably equal to twice the capacitance of either capacitor 113 or capacitor 115, which are preferably of the same value. When a narrowband signal with a center frequency of $\omega_0$ radian/second is fed into the embodiment, the capacitance of capacitor 113 and capacitor 115 is preferably the same and is:

$$C = \frac{1}{\sqrt{2}\ Z_0 \omega_0} \text{ Farads} \tag{1}$$

and the inductance of inductor 117 and inductor 119 is preferably the same and is:

$$L = \frac{\sqrt{2}\ Z_0}{\omega_0} \text{ Henrys} \tag{2}$$

It will be clear to those skilled in the art how to make and use embodiments of the present invention which are unbalanced, that is, split a signal into two signals in other than a 50-50 split. It will also be clear to those skilled in the art how to make and use embodiments of the present invention which will combine two signals and give disproportionate weight to one of them.

Figure 2:
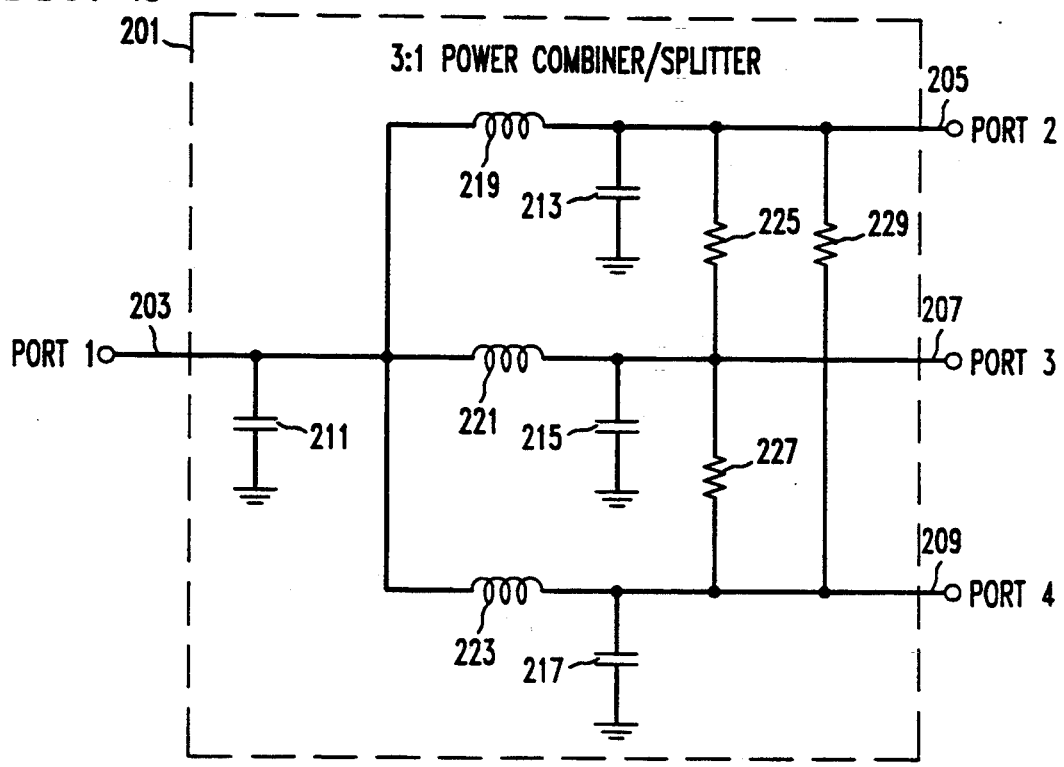
FIG. 2 shows a schematic diagram of another illustrative embodiment which functions as either a 3:1 combiner or splitter, depending on context.

The illustrative embodiment shown in FIG. 2 is typical of the generalized N:1 combiner/splitter, for N=3. It will be clear to those skilled in the art how to make and use embodiments of the present invention for N>3, from extrapolating the description of the embodiments shown in FIG. 1 and FIG. 2.

The illustrative embodiment in FIG. 2 comprises ten lumped elements: capacitor 211, capacitor 213, capacitor 215, capacitor 217, inductor 219, inductor 221, inductor 223, resistor 225, resistor 227 and resistor 229.

When the characteristic impedance of the embodiment is desired to be $Z_0$ ohms at each port, the value of each resistor (i.e., resistor 225, resistor 227 and resistor 229) is preferably equal to $3Z_0$ ohms. The capacitance of capacitor 211 is preferably equal to three times (because N=3) the capacitance of either capacitor 213, capacitor 215 or capacitor 217, which are preferably of the same value. When a narrowband signal with a center frequency of $\omega_0$ radian/second is fed into the embodiment, the capacitance of capacitor 213, capacitor 215 and capacitor 217 is preferably:

$$C = \frac{1}{\sqrt{N}\ Z_0 \omega_0} \text{ Farads} \tag{3}$$

and the inductance of inductor 117 and inductor 119 is preferably:

$$L = \frac{\sqrt{N} \, Z_0}{\omega_0} \text{ Henrys} \quad (4)$$

It will be clear to those skilled in the art how to make and use embodiments of the present invention which are unbalanced, that is, either combine or split a signal in a different proportion.

Figure 3:
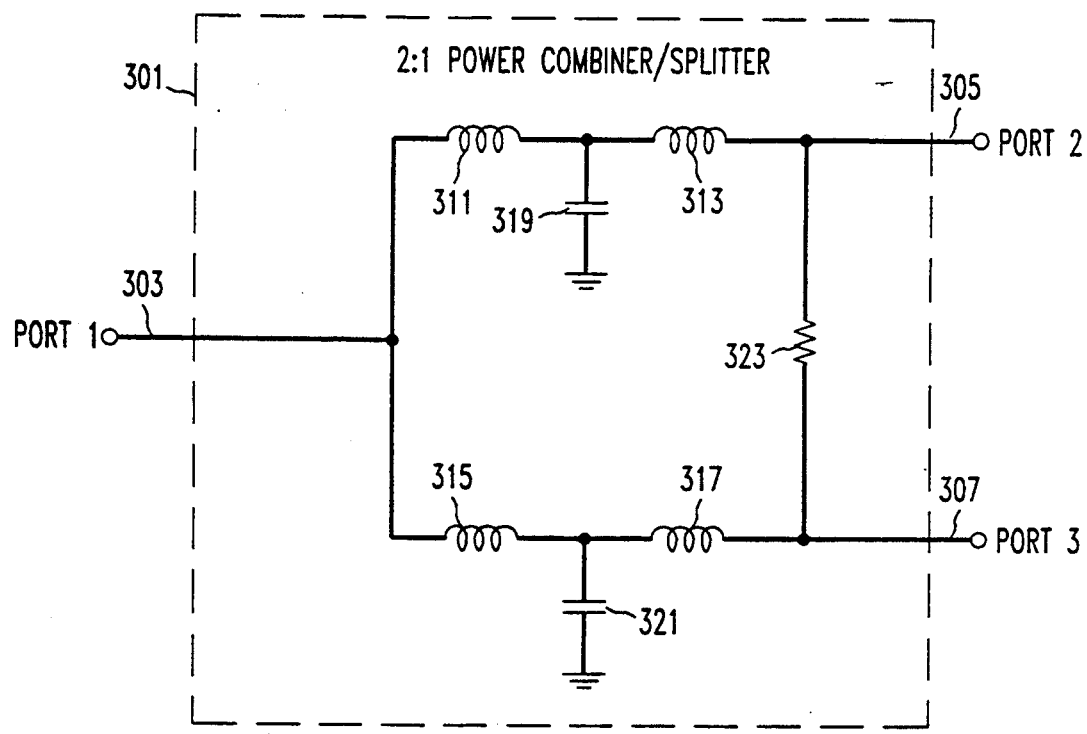
FIG. 3 shows a schematic diagram of yet another illustrative embodiment of the present invention which functions as either a 2:1 combiner or splitter, depending on context.

As shown in FIG. 3, the illustrative embodiment comprises seven lumped elements: capacitor 319, capacitor 321, inductor 311, inductor 313, inductor 315, inductor 317 and resistor 323. When the characteristic impedance of the embodiment is desired to be $Z_0$ ohms at each port, the value of resistor 323 is preferably chosen to be $2Z_0$ ohms. When a narrowband signal with a center frequency of $\omega_0$ radians/second is fed into the embodiment, the capacitance of capacitor 319 and capacitor 321 is preferably:

$$C = \frac{1}{\sqrt{2} \, Z_0 \omega_0} \text{ Farads} \quad (5)$$

and the inductance of inductor 311, inductor 313, inductor 315 and inductor 317 preferably:

$$L = \frac{\sqrt{2} \, Z_0}{\omega_0} \text{ Henrys} \quad (6)$$

It will be clear to those skilled in the art how to make and use embodiments of the present invention which are unbalanced, that is, neither combine or split a signal in a 50/50 proportion.

Figure 4:
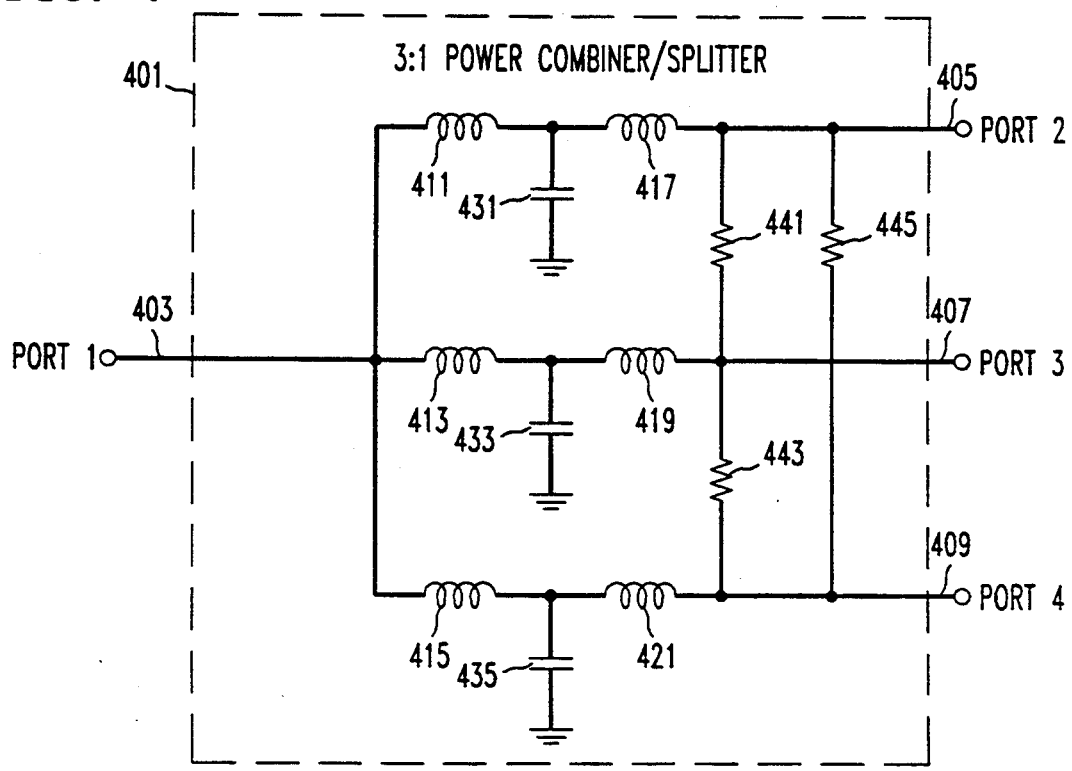
FIG. 4 shows a schematic diagram of another illustrative embodiment of the present invention which functions as either a 3:1 combiner or splitter depending on context.

The illustrative embodiment in FIG. 4 comprises twelve lumped elements: inductor 411, inductor 413, inductor 415, inductor 417, inductor 419, inductor 421, capacitor 431, capacitor 433, capacitor 435, resistor 441, resistor 443 and resistor 445. When the characteristic impedance of the embodiment is desired to be $Z_0$ ohms at each port, the value of each resistor (i.e., resistor 441, resistor 443 and resistor 445) is preferably chosen to be $3Z_0$ ohms, because N=3. When a narrowband signal with a center frequency of $\omega_0$ radian/second is fed into the embodiment, the capacitance of capacitor 431, capacitor 433 and capacitor 435 is preferably:

$$C = \frac{1}{\sqrt{N} \, Z_0 \omega_0} \text{ Farads} \quad (7)$$

and the value of each of the six inductors is preferably:

$$L = \frac{\sqrt{N} \, Z_0}{\omega_0} \text{ Henrys} \quad (8)$$

It will be clear to those skilled in the art how to make and use embodiments of the present invention which are unbalanced, that is, either combine or split a signal in a different proportion.

It will be clear to those skilled in the art that two or more embodiments of the present invention can be ganged, or cascaded, so as to make a compound combiner/splitter.

What is claimed is:

1. An apparatus comprising:
   a first inductor having a first terminal and a second terminal, said first terminal of said first inductor being connected to a first port and said second terminal of said first inductor being connected to a second port;
   a second inductor having a first terminal and a second terminal, said first terminal of said second inductor being connected to said first terminal of said first inductor and said first port, and said second terminal of said second inductor being connected to a third port;
   a first capacitor having a first terminal and a second terminal, said first terminal of said first capacitor being connected to said second terminal of said first inductor and said second port;
   a second capacitor having a first terminal and a second terminal, said first terminal of said second capacitor being connected to said second terminal of said second inductor and said third port;
   a third capacitor having a first terminal and a second terminal, said first terminal of said third capacitor being connected to said first terminal of said first inductor, and wherein said third capacitor has a capacitance substantially equal to twice the capacitance of said first capacitor and;
   a resistor having a first terminal and a second terminal, said first terminal of said resistor being connected to said second terminal of said first inductor and said second port, and said second terminal of said resistor being connected to said second terminal of said second inductor and said third port.

2. The apparatus of claim 1 wherein said apparatus exhibits an impedance at said first port of $Z_0$ and said first inductor exhibits an inductance of L Henrys and said first capacitor exhibits a capacitance of $L/2Z_0^2$ Farads.

3. An apparatus comprising:
   a first inductor having a first terminal and a second terminal, said first terminal of said first inductor being connected to a first port;
   a second inductor having a first terminal and a second terminal, said first terminal of said second inductor being connected to said second terminal of said first inductor and said second terminal of said second inductor being connected to a second port;
   a first capacitor having a first terminal and a second terminal, said first terminal of said first capacitor being connected to said second terminal of said first inductor;
   a third inductor having a first terminal and a second terminal, said first terminal of said third inductor being connected to said first terminal of said first inductor and said first port;
   a fourth inductor having a first terminal and a second terminal, said first terminal of said fourth inductor being connected to said second terminal of said third inductor and said second terminal of said fourth inductor being connected to a third port;
   a second capacitor having a first terminal and a second terminal, said first terminal of said second capacitor being connected to said second terminal of said third inductor; and
   a resistor having a first terminal and a second terminal, said first terminal of said resistor being connected to said second terminal of said second inductor and said second port, and said second terminal of said resistor being connected to said second terminal of said fourth inductor and said third port;

wherein said apparatus exhibits an impedance at said first port of $Z_0$, said first inductor exhibits an inductance of L Henrys and said first capacitor exhibits a capacitance of $L/2Z_0^2$ Farads.

4. An apparatus comprising:

a first inductor having a first terminal and a second terminal, said first terminal of said first inductor being connected to a first port and said second terminal of said first inductor being connected to a second port;

a second inductor having a first terminal and a second terminal, said first terminal of said second inductor being connected to said first terminal of said first inductor and said first port, and said second terminal of said second inductor being connected to a third port;

a third inductor having a first terminal and a second terminal, said first terminal of said third inductor being connected to said first terminal of said first inductor and said first port, and said second terminal of said third inductor being connected to a fourth port;

a first capacitor having a first terminal and a second terminal, said first terminal of said first capacitor being connected to said second terminal of said first inductor and said second port;

a second capacitor having a first terminal and a second terminal, said first terminal of said second capacitor being connected to said second terminal of said second inductor and said third port;

a third capacitor having a first terminal and a second terminal, said first terminal of said third capacitor being connected to said second terminal of said third inductor and said fourth port;

a fourth capacitor having a first terminal and a second terminal, said first terminal of said fourth capacitor being connected to said first terminal of said first inductor, and wherein said fourth capacitor exhibits a capacitance substantially equal to three times the capacitance of said first capacitor;

a first resistor having a first terminal and a second terminal, said first terminal of said first resistor being connected to said second terminal of said first inductor, and said second terminal of said first resistor being connected to said second terminal of said second inductor;

a second resistor having a first terminal and a second terminal, said first terminal of said second resistor being connected to said second terminal of said second inductor, and said second terminal of said second resistor being connected to said second terminal of said third inductor; and a third resistor having a first terminal and a second terminal, said first terminal of said third resistor being connected to said second terminal of said third inductor and said fourth port, and said second terminal of third resistor being connected to said second terminal of said first inductor.

5. The apparatus of claim 4 wherein said apparatus exhibits an impedance at said first port of $Z_0$, said first inductor exhibits an inductance of L Henrys and said first capacitor exhibits a capacitance of substantially $L/2Z_0^2$ Farads.

6. An apparatus comprising:

a first inductor having a first terminal and a second terminal, said first terminal of said first inductor being connected to a first port;

a second inductor having a first terminal and a second terminal, said first terminal of said second inductor being connected to said second terminal of said first inductor and said second terminal of said second inductor being connected to a second port;

a first capacitor having a first terminal and a second terminal, said first terminal of said first capacitor being connected to said second terminal of said first inductor;

a third inductor having a first terminal and a second terminal, said first terminal of said third inductor being connected to said first terminal of said first inductor and said first port;

a fourth inductor having a first terminal and a second terminal, said first terminal of said fourth inductor being connected to said second terminal of said third inductor and said second terminal of said fourth inductor being connected to a third port;

a second capacitor having a first terminal and a second terminal, said first terminal of said second capacitor being connected to said second terminal of said third inductor;

a fifth inductor having a first terminal and a second terminal, said first terminal of said fifth inductor being connected to said first terminal of said first inductor and said first port;

a sixth inductor having a first terminal and a second terminal, said first terminal of said sixth inductor being connected to said second terminal of said fifth inductor and said second terminal of said sixth inductor being connected to a fourth port;

a third capacitor having a first terminal and a second terminal, said first terminal of said third capacitor being connected to said second terminal of said fifth inductor;

a first resistor having a first terminal and a second terminal, said first terminal of said first resistor being connected to said second terminal of said second inductor, and said second terminal of said first resistor being connected to said second terminal of said fourth inductor;

a second resistor having a first terminal and a second terminal, said first terminal of said first resistor being connected to said second terminal of said fourth inductor, and said second terminal of said second resistor being connected to said second terminal of said sixth inductor; and a third resistor having a first terminal and a second terminal, said first terminal of said third resistor being connected to said second terminal of said sixth inductor, and said second terminal of said third resistor being connected to said second terminal of said second inductor;

wherein said apparatus exhibits an impedance at said first port of $Z_0$, said first inductor and said second inductor each exhibit an inductance of L Henrys and said first capacitor and said second capacitor each exhibit a capacitance of substantially $L/2Z_0^2$ Farads.

7. An apparatus comprising:

a first port, a second port, and a third port;

a first inductor between said first port and said second port;

a second inductor between said first port and said third port;

a resistor between said second port and said third port;

a first capacitor between said second port and ground;

a second capacitor between said third port and ground; and a third capacitor between said first port and ground;

wherein said third capacitor exhibits a capacitance substantially equal to N times the capacitance exhibited by said first capacitor, where N is a whole number.

8. The apparatus of claim 7 wherein said apparatus exhibits an impedance at said first port of $Z_0$, said first inductor exhibits an inductance of L Henrys and said first capacitor exhibits a capacitance of $L/2Z_0^2$ Farads.

9. An apparatus comprising:

a first port, a second port, a third port, and a fourth port;

a first inductor between said first port and said second port;

a second inductor between said first port and said third port;

a resistor between said second port and said third port;

a first capacitor between said second port and ground;

a second capacitor between said third port and ground;

a third capacitor between said first port and ground;

wherein said third capacitor exhibits a capacitance substantially equal to N times the capacitance exhibited by said first capacitor, where N is a whole number and wherein said apparatus exhibits an impedance at said first port of $Z_0$, said first inductor exhibits an inductance of L Henrys and said first capacitor exhibits a capacitance of $L/2Z_0^2$ Farads.

10. An apparatus comprising:

a first port, a second port, and a third port;

a first inductor between said first port and said second port;

a second inductor in series with said first inductor, with respect to said first port and said second port;

a third inductor between said first port and said third port;

a fourth inductor between in series with said third inductor, with respect to said first port and said third port;

a first capacitor in series with said first inductor, with respect to said first port and ground;

a second capacitor in series with said third inductor, with respect to said first port and ground; and a resistor between said second port and said third port;

wherein said apparatus exhibits an impedance at said first port of $Z_0$, said first inductor exhibits an inductance of L Henrys and said first capacitor exhibits a capacitance of $L/2Z_0^2$ Farads.

11. An apparatus comprising:

a first port, a second port, a third port and a fourth port;

a first inductor between said first port and said second port;

a second inductor in series with said first inductor, with respect to said first port and said second port;

a third inductor between said first port and said third port;

a fourth inductor in series with said third inductor, with respect to said first port and said third port;

a first capacitor in series with said first inductor, with respect to said first port and ground;

a second capacitor in series with said third inductor, with respect to said first port and ground; and a resistor between said second port and said third port wherein said apparatus exhibits an impedance at said first port of $Z_0$, said first inductor exhibits an inductance of L Henrys and said first capacitor exhibits a capacitance of $L/2Z_0^2$ Farads.

* * * * *